United States Patent [19]

Calligaro

[11] Patent Number: 4,982,269
[45] Date of Patent: Jan. 1, 1991

[54] BLANAR-TYPE MICROWAVE INTEGRATED CIRCUIT WITH AT LEAST ONE MESA COMPONENT, METHOD OF FABRICATION THEREOF

[75] Inventor: Michel Calligaro, St Remy Les Chevreuses, France

[73] Assignee: Thomson Hybrides et Microondes, Paris, France

[21] Appl. No.: 348,683

[22] Filed: May 8, 1989

[30] Foreign Application Priority Data

May 10, 1988 [FR] France ............................. 8806278

[51] Int. Cl.⁵ .................. H01L 21/318; H01L 29/06; H01L 29/48
[52] U.S. Cl. ........................................ 357/56; 357/54; 437/203
[58] Field of Search ........................................ 357/56

[56] References Cited

U.S. PATENT DOCUMENTS

| | | | |
|---|---|---|---|
| 4,105,810 | 8/1978 | Yamazaki et al. | 357/73 |
| 4,219,835 | 8/1980 | Van Loon et al. | 357/56 |
| 4,298,881 | 11/1981 | Sakurada et al. | 357/56 |
| 4,481,707 | 11/1984 | Cunniff | 357/56 |
| 4,596,070 | 6/1986 | Bayraktaroglu | 357/56 |
| 4,604,591 | 8/1986 | Vasile | 357/56 |
| 4,675,984 | 6/1987 | Hsu | 357/56 |
| 4,719,498 | 1/1988 | Wada et al. | 357/56 |
| 4,725,561 | 2/1988 | Haond et al. | 357/56 |
| 4,729,006 | 3/1988 | Dally et al. | 357/56 |
| 4,734,749 | 3/1988 | Levi | 357/56 |
| 4,751,561 | 6/1988 | Jastrzobski | 357/56 |
| 4,794,093 | 12/1988 | Tong et al. | 437/203 |
| 4,797,715 | 1/1989 | Thillays et al. | 357/56 |
| 4,807,022 | 2/1989 | Kazior et al. | 357/68 |
| 4,859,633 | 8/1989 | Bayraktaroglu | 437/211 |

FOREIGN PATENT DOCUMENTS

| | | |
|---|---|---|
| 0109887 | 5/1984 | European Pat. Off. . |
| 0197861 | 10/1986 | European Pat. Off. . |
| 2216424 | 10/1972 | Fed. Rep. of Germany . |
| 2330144 | 5/1977 | France . |
| 2508706 | 12/1982 | France . |
| 2538616 | 6/1984 | France . |
| 52-30185 | 3/1977 | Japan . |
| 0158488 | 12/1981 | Japan . |
| 0161366 | 9/1983 | Japan ..................................... 357/56 |
| 2003662 | 3/1979 | United Kingdom . |
| 2129213 | 4/1984 | United Kingdom . |

OTHER PUBLICATIONS

L. Maheux, "Transistor for Monolithic Circuits", IBM TDB, vol. 11, No. 12, May/69, pp. 1690-1691.

Primary Examiner—Andrew J. James
Assistant Examiner—Viet Q. Nguyen
Attorney, Agent, or Firm—Oblon, Spivak, McClelland, Maier & Neustadt

[57] ABSTRACT

A microwave integrated circuit having planar and mesa components and microstrip lines. To preserve a constant impedance for the microstrip lines, the mesa component is buried in a recess, which is then filled with a dielectric having substantially the same thermal expansion coefficient and the same dielectric constant as the insulating substrate. The surface of the mesa component and of the dielectric is in the plane of the planar part of the integrated circuit. Between the interconnecting microstrip lines on the planar face and the ground plane on the face of the substrate, the thickness and the dielectric constant of the material is constant.

5 Claims, 2 Drawing Sheets

BLANAR-TYPE MICROWAVE INTEGRATED CIRCUIT WITH AT LEAST ONE MESA COMPONENT, METHOD OF FABRICATION THEREOF

BACKGROUND OF THE INVENTION

1. Field of the Invention

The present invention relates to a microwave integrated circuit which is of the planar type, but has at least one mesa type semiconductor component of the mesa type. It also concerns a method for the fabrication of this microwave integrated circuit.

2. Description of the Prior Art

The materials on which the invention can be applied are group III-V type materials, such as GaAs, AlGaAs or InP, although it is not restricted to these materials. It can also be applied on silicon since certain silicon diodes of the PIN, IMPATT or other types operate at up to 100 GHz and beyond.

It is known that, in the field of microwave frequencies, mesa components, namely components having a vertical structure with exposed flanks, are the most efficient ones. However, owing to the frequency itself, these components are very small in size, and it is difficult and complicated to assemble them on a ceramic or dielectric (semi-insulating GaAs for example) substrate to make a circuit therefrom. If these mesa components are integrated into a planar integrated circuit, first of all they jut out on the circuit, and this does not facilitate subsequent masking and metallization operations for example and, secondly, their connection through the upper face of the mesa requires additional operations so that the connection metallization on the mesa does not short-circuit the semiconducting layers on the flanks of the mesa.

SUMMARY OF THE INVENTION

It is an object of the invention to propose a planar-type microwave integrated circuit, namely one for which the unoccupied face opposite the substrate is very substantially plane, namely an integrated circuit wherein at least one mesa component is buried in a recess hollowed in the semiconducting layers, and one dielectric material of which fills this recess, around the mesa component, so as to reconstitute a plane surface on which the interconnection lines, or microstrip lines, are deposited.

According to another object of the invention, the dielectric material which fills the recess, around the mesa component, has a coefficient of expansion and a dielectric constant which are equal to or very close to those of the semiconducting material.

According to another object of the invention, the connections providing access to the plateau or mesa, made by a metallization according to planar technology, eliminate the heat-compressed wire connection inductors, and the microstrip lines deposited on the surface of the integrated circuit have a constant impedance since the thickness and the dielectric constant of their support are constant.

More precisely, the invention comprises a planar-type microwave integrated circuit, including at least one mesa-type component, borne by a substrate made of a semi-insulating, semiconducting material, wherein said mesa component is located in a recess hollowed out in the chip of the integrated circuit, said recess being filled, around the mesa component, by a dielectric, the upper surface of which is in the plane of the surface of the planar components, the interconnections between planar components and the mesa being made, on the upper face of the chip, by means of microstrip lines in direct contact with said components while the metallized lower face of the substrate forms a ground plane for the microstrip line.

BRIEF DESCRIPTION OF THE DRAWINGS

The invention will be better understood from the following more detailed description of an embodiment and of two examples of its fabrication method, made with reference to the appended figures, of which.

To make the description more precise, the invention shall be explained with reference to the example of an integrated circuit made of GaAs, without this being a limitation on the scope of the invention, which applies to all semiconducting materials suited to microwaves.

DESCRIPTION OF A PREFERRED EMBODIMENT

Figure 1:
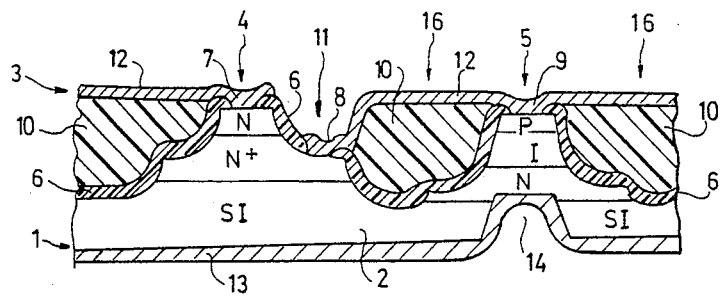
FIG. 1 shows a sectional view of a microwave integrated circuit according to the invention, comprising two mesa-type diodes.

FIG. 1 shows a sectional view of that part of a planar integrated circuit including at least one mesa semiconducting component: as a non-restrictive example, this drawing shows two diodes with different structures.

This integrated circuit is a GaAs chip which has two main faces: face 1 on the substrate 2 side and face 3, which is opposite the preceding face, and is plane. Its planeity is high in order to minimize unwanted elements such as inductors and capacitors at millimetric frequencies and in wide-band use.

One region of this planar integrated circuit has a recess in which there are two mesa diodes 4 and 5. The recess and the mesas are such that the upper plane of the mesas is identical with the plane of the planar face 3 of the integrated circuit. Each mesa is covered, on its flanks, by a barrier layer 6 made, for example, of silicon nitride $Si_3N_4$ which is open only at the positions of the contact terminals 7, 8 and 9 on the diodes 4 and 5. To preserve the planeity of the planar face 3 of the integrated circuit, the recess is filled, around the mesas, with a dielectric material 10 which is perforated, if necessary, to make an electrical contact, at 11 for example.

The contact and interconnection metallizations are etched on the planar surface 3 of the integrated circuit, and they may be of the microstrip type.

The invention provides for the dielectric material 10 to have the same expansion coefficient as the substrate 2 made of GaAs, so that the integrated circuit is not destroyed during operation, and so that there is a dielectric constant $E_1$ which is very close to the dielectric constant $E_2$ of the substrate: for example, a glass made up of oxides $Al_2O_3 + ZnO + SiO_2$ with $B_1 = 12$ is appropriate for use with a GaAs semi-insulating substrate with $E_2 = 12.5$.

Thus, between the microstrip lines 12, borne by the planar surface 3 of the integrated circuit, and their ground plane 13, formed by a metallization of the surface 1 of the substrate, the thickness and dielectric constant of the different materials, GaAs or glass, are constant: there are no variations in the impedance of the microstrip lines.

In a mesa component, the electrical contacts are, by definition, made in two different planes. In the example chosen to explain the invention, a first component 4 has a first contact 7 made in the plane 3 and a second contact 8 made on a lower layer, in the bottom of a well 11 hollowed out in the dielectric 10. A second component 5 has a first contact 9 made in the plane 3 and a second contact made through the rear face by means of a perforation 14 in the substrate 2.

The structural detail of the mesa components 4 and 5 is not precise. The invention concerns at least one mesa component buried in a dielectric which fills a recess in a planar integrated circuit. This component may be a diode or a transistor, and may consist of a number of layers. This number is not within the field of the invention. A Schottky diode made on the N—N+ layers and a PIN diode are shown only to give a concrete shape to the invention.

The description of the method for the fabrication of this integrated circuit will enable a better understanding of its structure.

Figure 2:
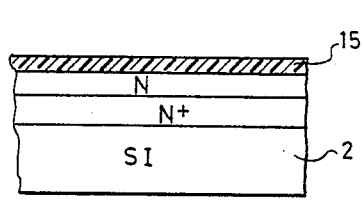
FIGS. 2 to 8 show steps of the method for the fabrication, according to the invention, of a planar integrated circuit including at least two mesa diodes of different types.

The initial product, shown in FIG. 2, is a wafer of substrate 2, made of semi-insulating GaAs. On this substrate 2, a first epitaxial operation, for example, is performed to grow the two layers of N and N+ GaAs, in which the diode 4 of FIG. 1 will be made. The total thickness of these layers is about 2 microns. Then, on this epitaxiated wafer, a first barrier layer 15, made of silicon nitride for example, is deposited with a thickness of 2000 angstroms.

Figure 3:
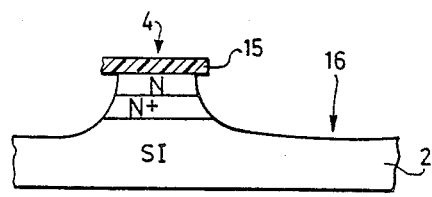

In the second step, shown in FIG. 3, an appropriate masking is used to preserve those regions of the barrier layer 15 that shield the future diode 4 and the planar parts of the integrated circuit (outside the field of the figure). After development, an etching operation creates a recess 16, of which the depth, which is about 4 microns, is equal to that of the component 5 and reaches the substrate 2.

At all events, the preliminary epitaxy concerns the thinnest component or components and the etching of the recess concerns the thickest component or components. If this were not so, the component 5 would lie on the deepest epitaxiated layer of the component 4.

Figure 4:
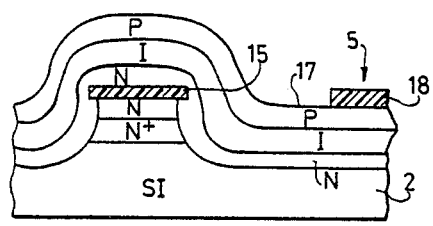

A second epitaxy operation, on the entire surface of the wafer, shown in FIG. 4, gives the active layer or layers of the component 5. Three layers of P, I and N doped GaAs have been shown therein, since a PIN diode has been chosen as an example of a mesa component 5. These layers cover the entire wafer, including the component 4, but it is important for their upper surface 17 to be in the same plane as the upper surface of the layers of the first epitaxy.

A second barrier layer 18, for example made of silicon nitride, is deposited on this upper surface 17. This barrier layer 18 has a thickness of 2000 angstroms. After masking, it is etched to preserve only that region which covers and shields the future mesa component 5.

Figure 5:
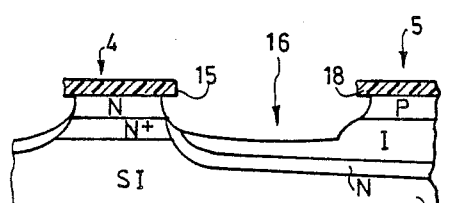

At this point of the fabrication method, the integrated circuit is no longer planar: it has the epitaxiated layers which surmount the planar region, and which are the P,I,N layers shown in FIG. 4 by way of example. It is therefore necessary to recover the planar surface of the integrated circuit either by mechanical/chemical polishing or by chemical etching. FIG. 5 shows the state of the integrated circuit after planarization by a chemical etching operation: the epitaxiated layers outside the regions shielded by the barrier layers 15 and 18 have been slightly attacked.

Figure 6:
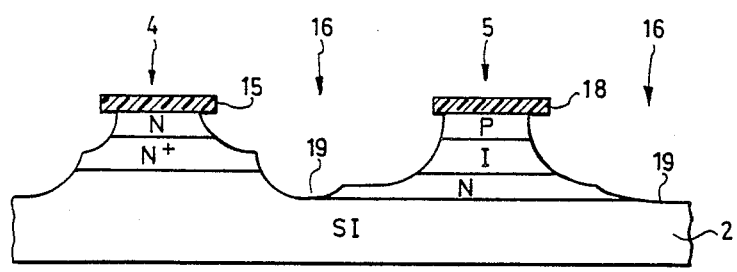

The chemical etching is continued so as to remove, as shown in FIG. 6, the layers of the second epitaxy located between the planar component 4 and the future mesa component 5. This etching, which creates the mesa, is continued until the substrate 2 is reached at 19: the vertical structure of the mesa 5 is therefore isolated.

Figure 7:
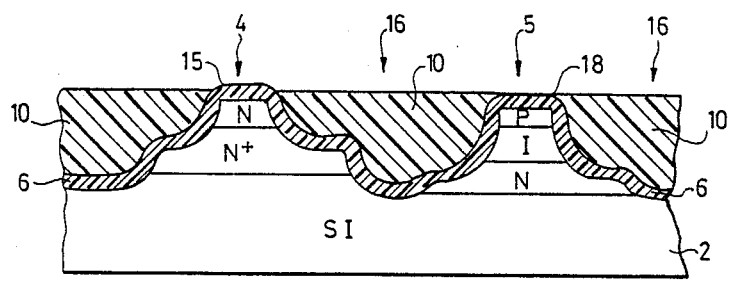

The flanks of a mesa structure are very generally shielded by a passivation layer. The deposition of a layer 6, of silicon nitride for example, is the first step shown in FIG. 7. This layer also covers the flanks of the planar regions, as well as the upper surface, but this entails no drawback: on the contrary, this passivation shields the layers of III-V materials against the oxygen contained in the glass of the next step.

The second step shown in this same figure consists in a planarized deposition, in the recess 16, of a dielectric 10 made of sintered glass powder. It is important for this dielectric to have substantially the same heat expansion coefficient and the same dielectric constant as the substrate of the integrated circuit. If this substrate is made of semi-insulating GaAs, a glass made up of a mixture of oxides would be quite appropriate. The dielectric 10 is polished, if necessary, to planarize it.

The planar surface is then masked, and then etched, to open electrical contact-making windows 7 and 9 on the passivation layer 6, on the upper layers of the components 4 and 5. If necessary, an aperture may be made at 11 in the passivation layer 6 so as to set up an electrical contact at 8 on a lower layer of the component.

Figure 8:
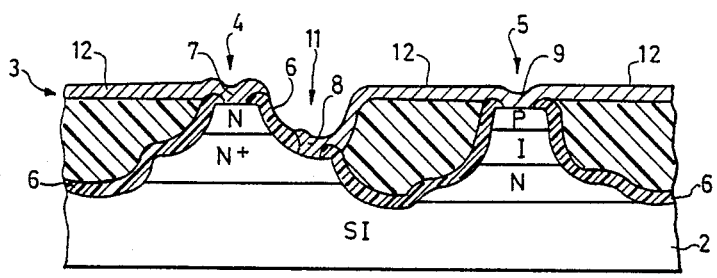

Finally, as shown in FIG. 8, the interconnections or microstrip lines 12 are deposited and etched on the planar surface 3 of the integrated circuit. The microstrip lines 12 have a constant impedance: for the dielectric 10 closes the recess 16 around the mesa, and it has the same dielectric constant as the substrate 2. There is therefore a constant thickness and no variation in dielectric constant between the microstrip lines 12 and the ground plane which remains to be deposited, on the lower face of the substrate.

The integrated circuit, shown in its completed state in FIG. 1, undergoes firstly, a lapping of the substrate 2 by its lower face, thus making it possible to adjust the impedance of the microstrip lines since it is known that this impedance depends on, among other factors, the dielectric thickness between line and ground plane. However, this thinning also facilitates the perforation, at 14, of a hole for re-making contact with the mesa structure 5, through the rear face of the integrated circuit. This hole 14 is perforated chemically by well-known processes, and it goes through the substrate 2 until it reaches the deepest layer of the mesa component 5.

All that remains to be done is to deposit a ground plane metallization 13 on the rear face of the substrate and in the hole 14 for re-making contact, to complete the integrated circuit according to the invention: it is a planar circuit because its upper surface is plane, but it has at least one mesa component "buried" in a recess plugged with a dielectric.

Figure 9:
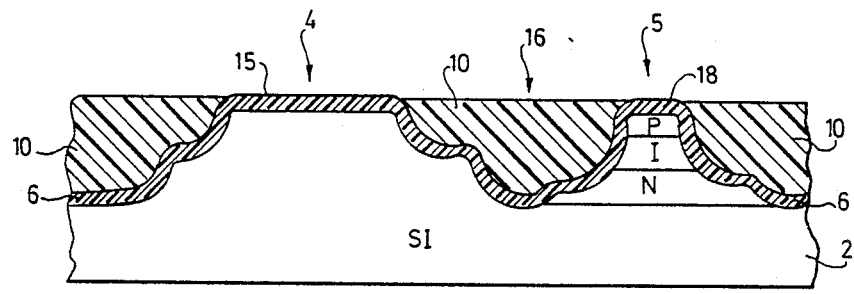
FIGS. 9 and 10 show the final steps of the method for the fabrication, according to the invention, of a planar integrated circuit including at least one planar transistor and one mesa diode.
Figure 10:
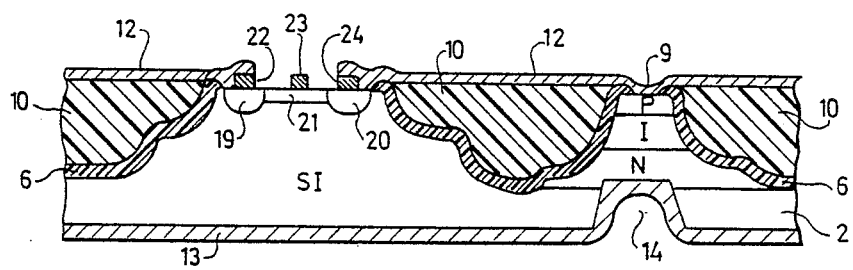

The integrated circuit according to the invention and its fabrication method have been explained in the case where at least one planar component has epitaxiated layers: this is the Schottky diode on an N—N+ junction. FIGS. 9 and 10 give the final steps of the fabrication method in the case where the planar components are implanted.

The method remains in accordance, in its first steps, with the description made with reference to FIGS. 2 to 6, except for the first epitaxy of the N and N+ layers. There are no longer any grounds for this epitaxy since the planar components are implanted. Under these conditions, the method results in the structure of FIG. 9, which is the counterpart of FIG. 7 in the preceeding case.

The planar surfaces 15 and 18 of the barrier layer 6 are then masked and etched: at 15 to bare, for example, the surface of a transistor to be implanted, and at 18 to bare a contact re-making point on the mesa diode 5. Then, in FIG. 10, at least one planar transistor 4 is implanted. The detail of the implanted regions has not been explained here because it is outside the field of the invention. These regions are, for example, two recesses 19 and 20 for source and drain access, and a channel 21. The source metallization 22, gate metallization 23 and drain metallization 24 are deposited, according to state-of-the-art rules, on the corresponding implanted regions.

The method ends, as above, with a thinning of the substrate 2, in order to adjust the impedance of the microstrip lines, and the deposition and etching of the metallizations 12 and 13 on the two faces with, if necessary, a re-making of contact at 14, by the rear face.

The method according to the invention enables the making of microstrip lines on planar, microwave integrated circuit chips having at least one mesa structure component which is buried in a recess and then plugged again with a dielectric. The upper access points, by microstrip lines, to the components eliminate the connecting inductors which, in the prior art, are created by wires or "bridge"-type features.

The method of the invention is used to make monolithic structures with shielding PIN diodes and Schottky diodes, varicap and transistor VCO oscillators, limiters or N-way change-over switches, in the form of planar integrated circuits.

What is claimed is:

1. A microwave semiconductor device having an upper surface and a lower surface, said upper surface and said lower surface being essentially planar and parallel, comprising:
    a semiconductive substrate;
    at least one semiconductive mesa component in a part of said substrate, the top of said mesa forming part of said upper surface;
    at least one planar component formed in a part of said substrate which extends upwardly to form part of said upper surface;
    a dielectric material forming the remainder of said upper surface, said dielectric material having the same thermal expansion coefficient and a dielectric constant as said substrate;
    a passivation layer between said dielectric material and both the substrate and mesa components;
    a metallization layer below said substrate to form a ground plane on said lower surface; and
    microstrip lines on said upper surface connecting said mesa components and planar components.

2. A semiconductor device according to claim 1, wherein the material is an $Al_2O_3+SiO_2+ZnO$ glass in the case where the substrate is made of GaAs.

3. A semiconductor device according to claim 1, wherein the dielectric material extends from the substrate to the upper surface.

4. A semiconductor device according to claim 1 wherein, between said upper surface and said lower surface, the thickness and the dielectric constant of the device between the microstrip lines and said metallization layer is constant.

5. A semiconductor device according to claim 4, wherein the thickness of the substrate is chosen and adjusted to define a characteristic impedance for the microstrip lines.

* * * * *